(12) United States Patent
Lee et al.

(10) Patent No.: US 12,727,235 B2
(45) Date of Patent: Sep. 1, 2026

(54) CONTACT RESISTANCE REDUCTION FOR DIRECT BACKSIDE CONTACT

(71) Applicant: Applied Materials, Inc., Santa Clara, CA (US)

(72) Inventors: Jae Young Lee, Bedford, MA (US); Johannes M. Van Meer, Middleton, MA (US); Yan Zhang, Westford, MA (US); Naushad K. Variam, Marblehead, MA (US)

(73) Assignee: Applied Materials, Inc., Santa Clara, CA (US)

( * ) Notice: Subject to any disclaimer, the term of this patent is extended or adjusted under 35 U.S.C. 154(b) by 440 days.

(21) Appl. No.: 18/242,943

(22) Filed: Sep. 6, 2023

(65) Prior Publication Data

US 2025/0081592 A1 Mar. 6, 2025

(51) Int. Cl.

| | |
|---|---|
| ***H10D 84/00*** | (2025.01) |
| ***H10D 30/67*** | (2025.01) |
| ***H10D 84/01*** | (2025.01) |
| ***H10D 84/03*** | (2025.01) |
| *H10D 84/85* | (2025.01) |
| *H10W 20/20* | (2026.01) |

(52) U.S. Cl.

CPC ....... *H10D 84/038* (2025.01); *H10D 30/6729* (2025.01); *H10D 84/017* (2025.01); *H10D 84/0186* (2025.01); *H10D 84/85* (2025.01); *H10W 20/20* (2026.01)

(58) Field of Classification Search

CPC ............. H10D 84/013; H10D 84/0149; H10D 84/017; H10D 84/0186

See application file for complete search history.

(56) References Cited

U.S. PATENT DOCUMENTS

| | | | | |
|---|---|---|---|---|
| 8,294,265 | B1 * | 10/2012 | Oh | H01L 24/11 257/737 |
| 10,714,334 | B2 | 7/2020 | Chang | |
| 2015/0255574 | A1 * | 9/2015 | Haensch | H10D 30/711 438/151 |
| 2018/0337188 | A1 * | 11/2018 | Yu | H10D 84/0184 |
| 2020/0020590 | A1 * | 1/2020 | Lu | H10D 84/0151 |

FOREIGN PATENT DOCUMENTS

| | | | | |
|---|---|---|---|---|
| KR | 20040057354 A | * | 7/2004 | H01L 21/02378 |

* cited by examiner

*Primary Examiner* — Reema Patel
(74) *Attorney, Agent, or Firm* — KDW Firm PLLC

(57) ABSTRACT

Disclosed herein are methods for direct backside contact formation. In some embodiments, a method may include providing a stack of layers defining a front side and a backside, wherein the front side comprises one or more devices, and forming a plurality of vias in the backside, wherein each via of the plurality of vias extends to a source/drain. The method may further include performing a dopant implant to the backside including into the plurality of vias, wherein the dopant implant is performed at a temperature greater than 300° C., forming a silicide region within each of the source/drains, and forming a backside contact within each of the plurality of vias, wherein the backside contact is formed over the silicide region.

20 Claims, 5 Drawing Sheets

CONTACT RESISTANCE REDUCTION FOR DIRECT BACKSIDE CONTACT

FIELD OF THE DISCLOSURE

The present embodiments relate to semiconductor device contact formation and, more particularly, to contact resistance reduction for direct backside contacts.

BACKGROUND OF THE DISCLOSURE

In advanced logic devices, processing thermal budges are limited due to the presence of metal interconnects, e.g., during front side processing. To form such devices, current approaches include the formation of an amorphous layer followed by a high-temperature anneal to repair lattice damage and activate dopants. This solid phase epitaxial regrowth (SPER) process may be challenging due to low-temperature requirements in different parts of the device, however.

Accordingly, improved approaches are needed to repair processing damage while also maintaining the thermal budget below the requirements of backside contacts.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In one aspect, a method for backside contact formation may include providing a stack of layers defining a front side and a backside, wherein the front side comprises one or more devices, and forming a plurality of vias in the backside, wherein each via of the plurality of vias extends to a source/drain. The method may further include performing a dopant implant to the backside including into the plurality of vias, wherein the dopant implant is performed at a temperature greater than 300° C., forming a silicide region within each of the source/drains, and forming a backside contact within each of the plurality of vias, wherein the backside contact is formed over the silicide region.

In another aspect, a method of dopant activation for backside contacts may include providing a stack of layers comprising a source/drain, wherein the stack of layers defines a front side and a backside, and forming a via in the backside, wherein the via extends to the source/drain. The method may further include delivering a dopant into the via, wherein the dopant impacts an exposed surface of the source/drain, and wherein the dopant is delivered at a temperature greater than 300° C., forming a silicide region along the exposed surface of the source/drain, and forming a backside contact within the via, wherein the backside contact is formed over the silicide region.

In yet another aspect, a method of forming backside via landings on a source/drain may include providing a stack of layers comprising the source/drain, wherein the stack of layers defines a front side and a backside, and forming a via in the backside, wherein the via extends to the source/drain. The method may further include delivering a dopant into the via, wherein the dopant impacts an exposed surface of the source/drain, and wherein the dopant is delivered at a temperature between 300° C.-400° C., forming a silicide region along the exposed surface of the source/drain, and forming a backside contact within the via, wherein the backside contact is formed over the silicide region.

BRIEF DESCRIPTION OF THE DRAWINGS

The accompanying drawings illustrate exemplary approaches of the disclosure, including the practical application of the principles thereof, as follows.

Figure 1:
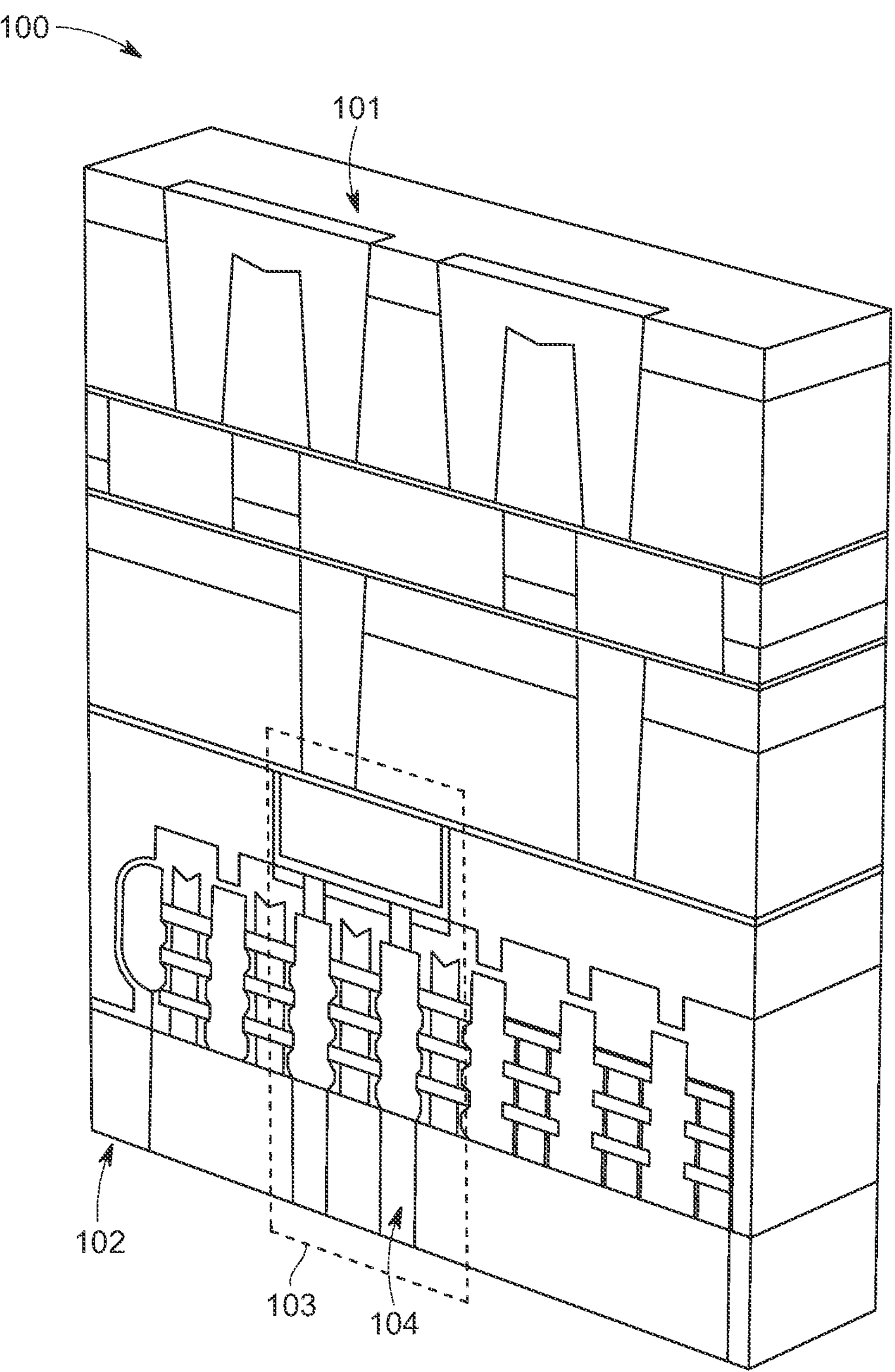
FIG. 1 illustrates a perspective view of a device according to embodiments of the present disclosure.

The drawings are not necessarily to scale. The drawings are merely representations, not intended to portray specific parameters of the disclosure. The drawings are intended to depict exemplary embodiments of the disclosure, and therefore are not to be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Methods and devices in accordance with the present disclosure will now be described more fully hereinafter with reference to the accompanying drawings, where various embodiments are shown. The methods and devices may be embodied in many different forms and are not to be construed as being limited to the embodiments set forth herein. Instead, these embodiments are provided so the disclosure will be thorough and complete, and will fully convey the scope of the methods to those skilled in the art.

As stated above, current state-of-the-art approaches for forming backside contacts use a pre-amorphization ion implant to form an amorphous layer followed by dopant implant and annealing step, such as a rapid thermal process or a high temperature millisecond laser anneal. By doing so, implant damage can be repaired and enhanced activation achieved by solid phase epitaxial regrowth. In the present embodiments, a heated dopant implant can help circumvent the annealing step, thereby meeting the low-temperature requirements set forth by the latest device architectures. Elimination of the annealing step reduces costs compared to conventional low temperature contact epitaxy solutions, and may provide an equal or enhanced dopant activation as compared to conventional approaches.

As will be described herein, a low-temperature dopant activation for backside contacts may include an ion implant at an elevated temperature (300° C.-400° C.) to minimize the implant induced defect formation by a so-called dynamic annealing process, while also providing for adequate contact resistance values. When combined with an optional pre-amorphization implant, the heated dopant implant aids with regrowth of amorphized epitaxial source and drain by a mechanism called ion assisted recrystallization process. In some embodiments, the method can be combined with an additional low temperature anneal (e.g., ≤650° C.) performed after the dopant implant.

FIG. 1 is a side cross-sectional view of an example device 100, such as a backside power distribution network without buried power rail, according to one or more embodiments of the disclosure. The device 100 may include a stack of layers and device components, and may be defined by a front side 101 and a backside 102. As will be described in greater detail herein, one or more contacts 104 may be formed in a portion 103 of the backside 102 of the device 100.

Figure 2:
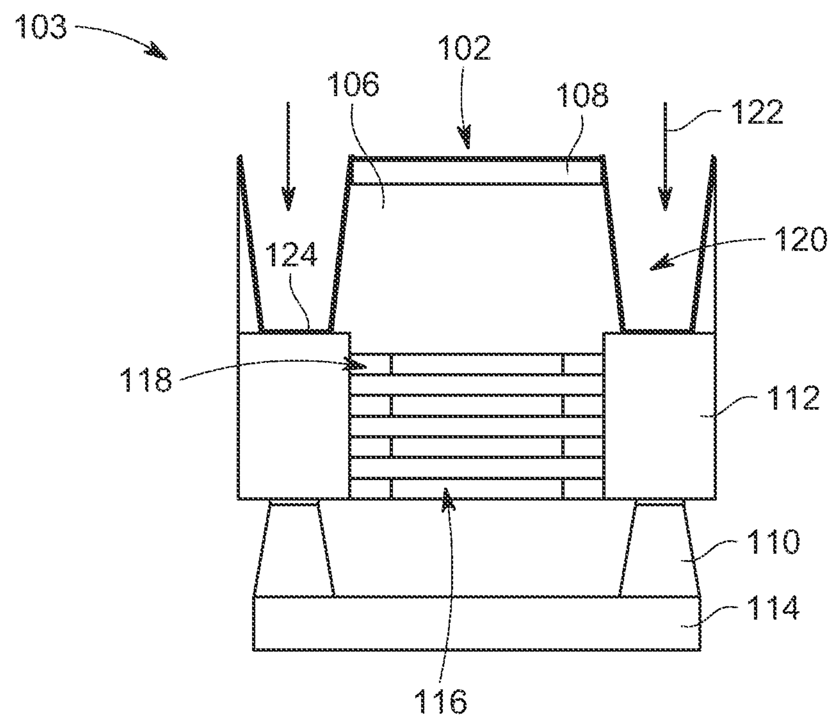
FIG. 2 illustrates a side cross-sectional view of a portion of the device during formation of a set of vias, according to embodiments of the present disclosure.

FIG. 2 demonstrates the portion 103 of the device 100 in greater detail. At this stage of processing, front side device formation, including a BEOL signal Cu interconnect, may already be performed. As shown, the portion 103 may include a substrate 106, an isolation oxide 108 formed in the substrate 106, and a set of front side contacts 110 extending between one or more source/drains (S/D) 112 and a BEOL copper interconnect 114. In some embodiments, each S/D 112 may be formed using a doped epitaxy process, as known. A gate 116 and spacer(s) 118 may be formed between the S/D 112. In some embodiments, the gate 116 may include a gate stack having a dielectric layer over an active area, a gate layer over the dielectric layer, and, in some instances, a mask layer over the gate layer. The dielectric layer, gate layer, and mask layer for the gate stack(s) may be formed by sequentially forming or depositing the respective layers, and then patterning those layers into the gate stacks.

Gate spacers 118 may be formed along sidewalls of the gate stacks and over the active areas on the substrate 106. The gate spacers 118 may be formed by conformally depositing one or more layers for the gate spacers 118 and etching the one or more layers. Although non-limiting, the one or more layers for the gate spacers 118 may include silicon nitride, silicon oxynitride, silicon carbon nitride, the like, multi-layers thereof, or a combination thereof, deposited by CVD, ALD, or another deposition technique. The etch process can include a RIE, NBE, or another etch process.

The S/D 112 may be formed on opposing sides of a gate stack by implanting dopants into the active areas using the gate 116 and gate spacers 118 as masks. Hence, the S/D 112 can be formed by implantation on opposing sides of each gate 116. The set of vias 120 may be formed in the backside 102 using, e.g., a reactive ion etch (RIE) process 122 to remove material of the substrate 106 to expose a surface 124 of each S/D 112.

Figure 3:
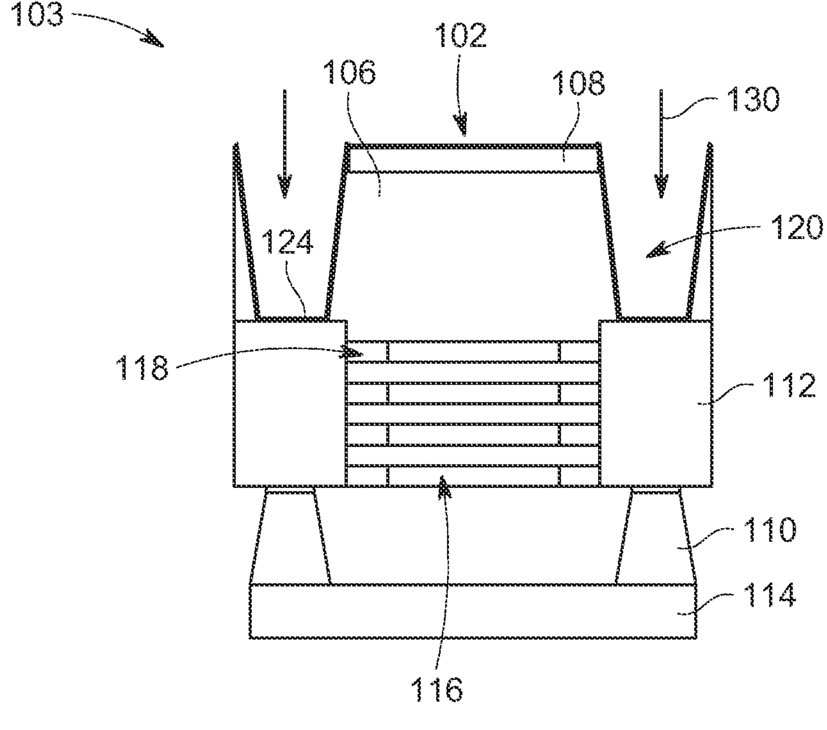
FIG. 3 illustrates a side cross-sectional view of the portion of the device during an optional pre-amorphization implant into the set of vias, according to embodiments of the present disclosure.

FIG. 3 illustrates the backside 102 of the device 100 during an optional pre-amorphization implant 130 into the vias 120, according to embodiments of the present disclosure. In some embodiments, the implant 130 will impact the surface 124 of each S/D 112, and may be a germanium pre-amorphization implant at an energy of approximately 1 keV to 4 keV and at a dose in the low e14 to mid e14 range. Embodiments herein are not limited in this context, however.

Figure 4:
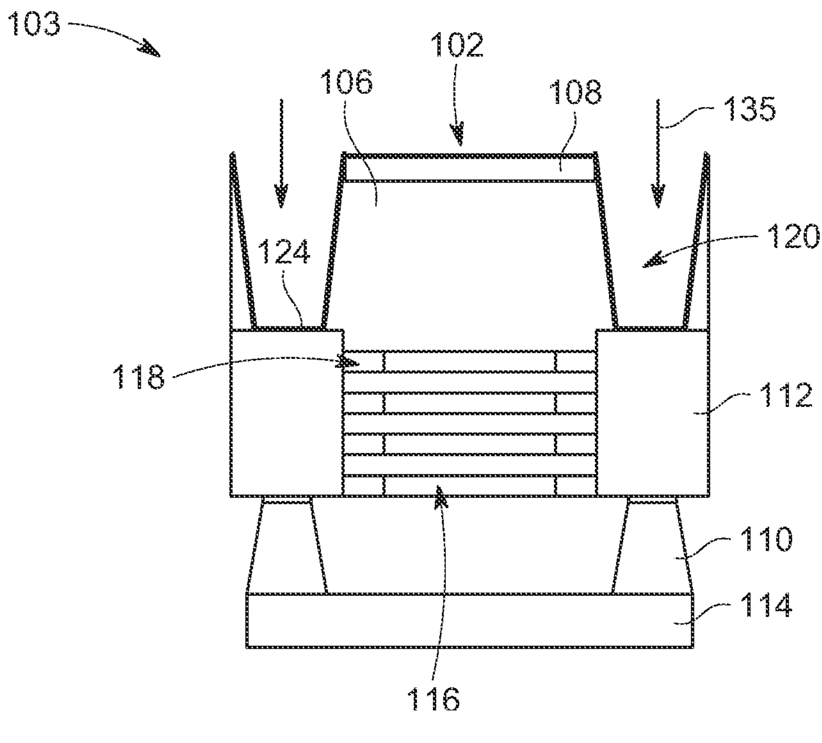
FIG. 4 illustrates a side cross-sectional view of the portion of the device during delivery of a dopant into the set of vias and into a source/drain, according to embodiments of the present disclosure.

As demonstrated in FIG. 4, the backside 102 of the device 100 may then receive a dopant implant 135, which is delivered through the vias 120 and into the exposed surfaces 124 of the S/D 112. In some embodiments, the dopant implant 135 is performed at an elevated temperature (e.g., between 300° C. and 400° C.), and the dopants may include one or more of boron, gallium, phosphorus, arsenic, or antimony. It will be appreciated that other dopants may be used in alternative embodiments. The dopant implant 135 helps to regrow the amorphized epitaxial S/D 112 via ion assisted recrystallization.

Figure 5:
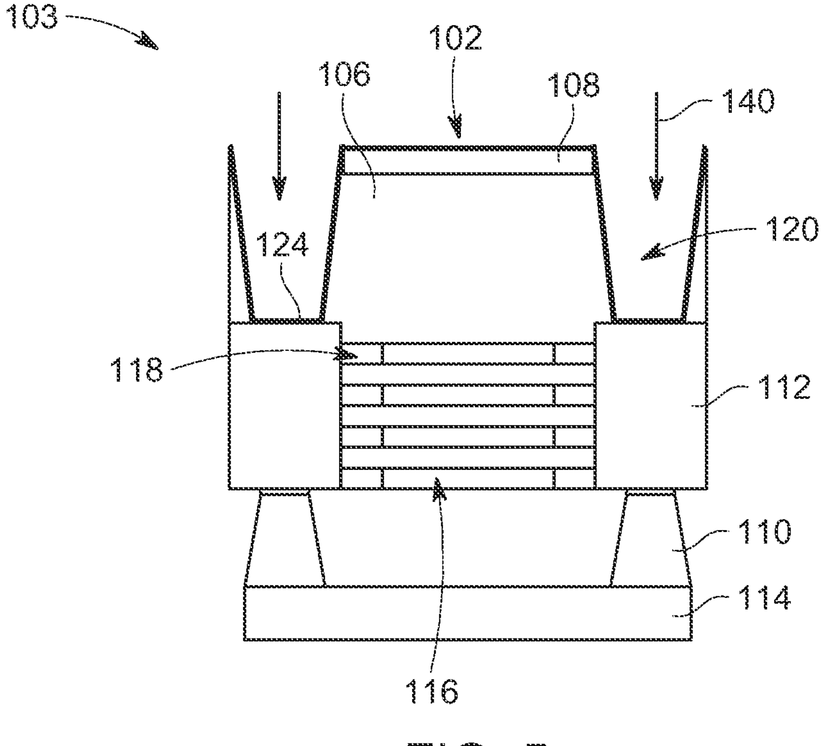
FIG. 5 illustrates a side cross-sectional view of the portion of the device during an optional low temperature anneal, according to embodiments of the present disclosure.

As demonstrated in FIG. 5, an optional low-temperature (e.g., below 650° C.) annealing process 140 may then be performed following the dopant implant 135. In some embodiments, the annealing process 140 may be a rapid laser anneal delivered through the vias 120 to further activate the dopants in the S/D 112.

Figure 6:
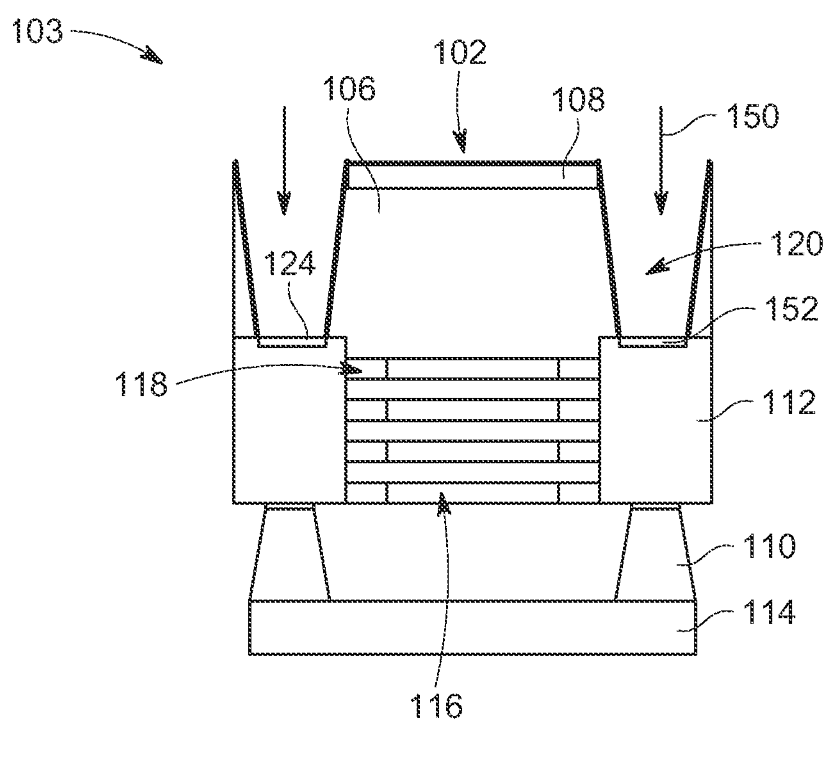
FIG. 6 illustrates a side cross-sectional view of the portion of the device following formation of a silicide region along an exposed surface of the source/drains, according to embodiments of the present disclosure.

As demonstrated in FIG. 6, a silicide region 152 may be formed along the exposed surface 124 of each S/D 112. Although nonlimiting, the silicide region 152 may be titanium silicide formed using a plasma-enhanced chemical vapor deposition (PECVD) titanium process 150.

Figure 7:
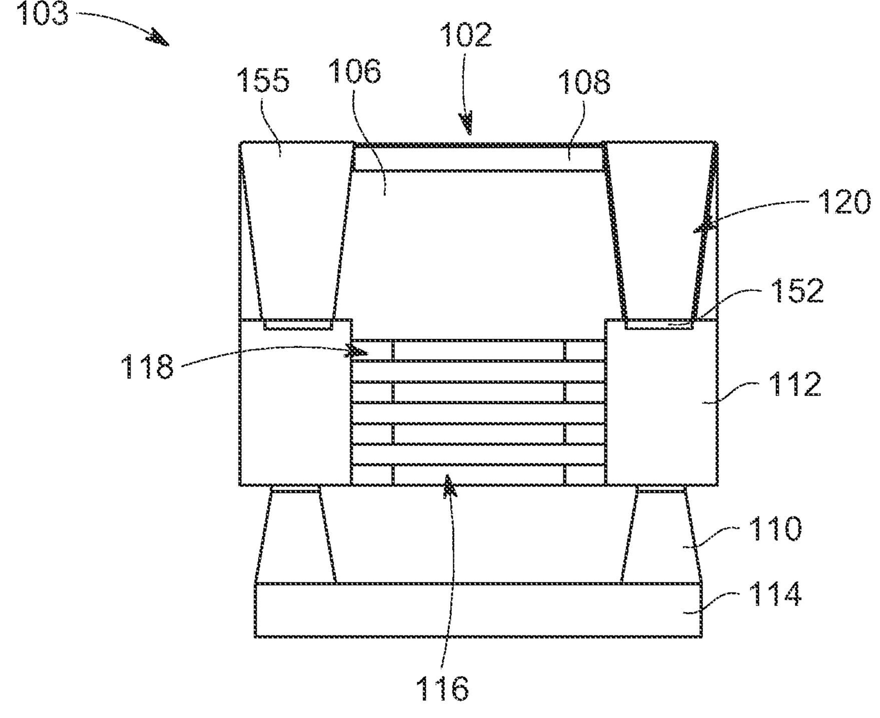
FIG. 7 illustrates a side cross-sectional view of the portion of the device following contact metallization, according to embodiments of the present disclosure.

Next, as demonstrated in FIG. 7, a conductive material may be deposited in the vias 120 and then planarized to form a set of backside contacts 155 in the device 100. Although nonlimiting, the conductive material may be, or comprise, a metal, such as cobalt, tungsten, copper, ruthenium, alloys thereof, the like, or a combination thereof, and may be deposited by CVD, ALD, PVD, or another deposition technique.

Although not shown, processing of the device 100 may continue following formation of the backside contacts 155, as known. Furthermore, although embodiments of the disclosure are described herein in the context of a backside power distribution network without buried power rail, it will be appreciated that the approaches of the present disclosure may also be applied to other advanced logic devices in which a back side contact requires high dopant activation at a low thermal budget due to the presence of either copper interconnects or bottom devices. For example, the approaches described herein may be applicable for sequential 3-D integration processes having a bottom tier CMOS requiring a relatively hot process, and a top tier CMOS requiring a relatively cold process due to the presence of one or more bottom devices. The approaches herein may also be used during CFET processing in which an NFET is provided on top of PFET, wherein the thermal budge of the NFET is limited due to the presence of one or more bottom devices. Other applications are further possible in alternative embodiments.

Figure 8:
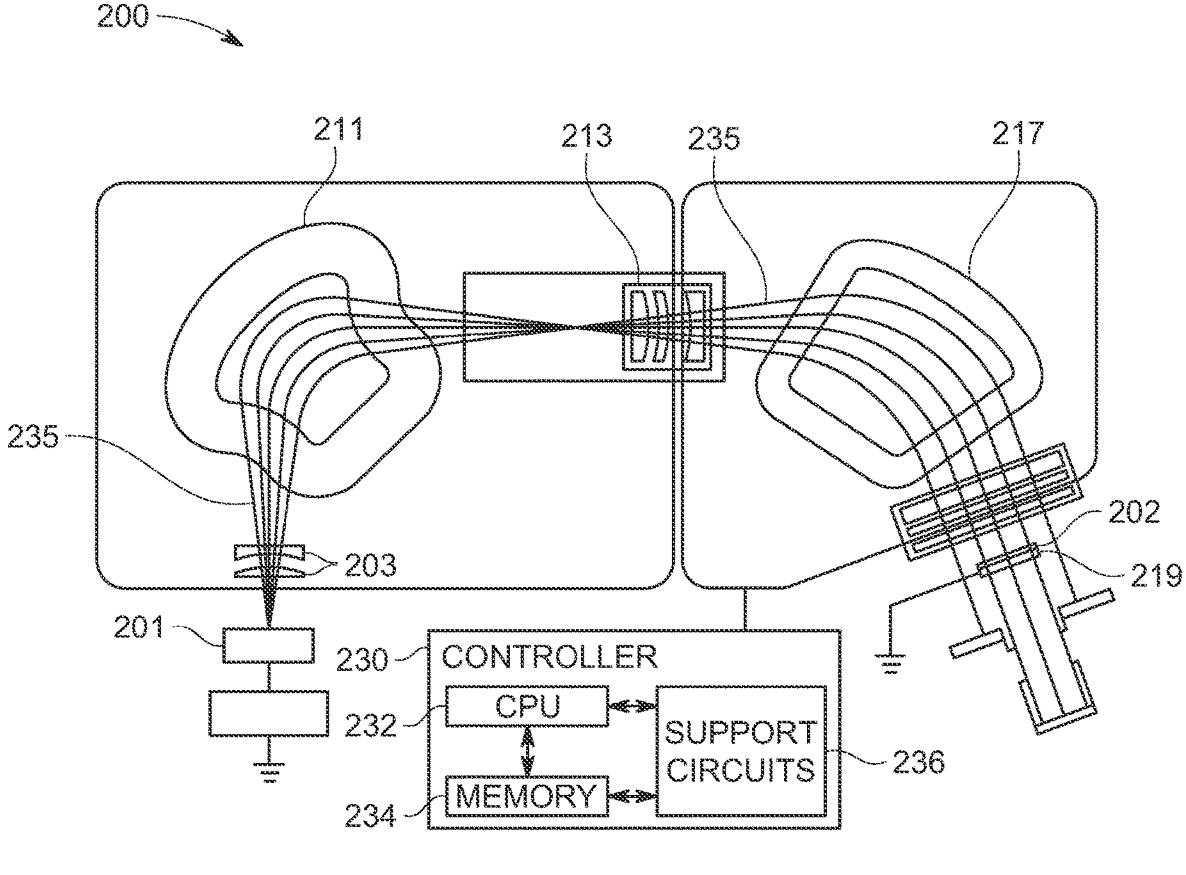
FIG. 8 illustrates a schematic diagram of a processing apparatus according to embodiments of the present disclosure.

FIG. 8 illustrates a schematic diagram of a processing apparatus 200 useful to perform processes described herein. One example of a beam-line ion implantation processing apparatus is the Varian VIISTA® Trident, available from Applied Materials Inc., Santa Clara, CA. The processing apparatus 200 may include an ion source 201 for generating ions. For example, the ion source 201 may provide a dopant implant, such as the dopant implant 135 demonstrated in FIG. 3. The ion source 201 may also provide an ion etch, such as the etch process for forming the vias 120 described with respect to FIG. 2.

The processing apparatus 200 may also include a series of beam-line components. Examples of beam-line components may include extraction electrodes 203, a magnetic mass analyzer 211, a plurality of lenses 213, and a beam parallelizer 217. The processing apparatus 200 may also include a platen 219 for supporting a substrate 202 to be processed. The substrate 202 may be the same as the substrate 106 described above. The substrate 202 may be moved in one or more dimensions (e.g. translate, rotate, tilt, etc.) by a component sometimes referred to as a "roplat" (not shown). It is also contemplated that the processing apparatus 200 may be configured to perform heated implantation processes to provide for improved control of implantation characteristics, such as the ion trajectory and implantation energy utilized to dope the substrate.

In operation, ions of the desired species, for example, dopant ions, are generated and extracted from the ion source 201. Thereafter, the extracted ions 235 travel in a beam-like state along the beam-line components and may be implanted in the substrate 202. Similar to a series of optical lenses that manipulate a light beam, the beam-line components manipulate the extracted ions 235 along the ion beam. In such a manner, the extracted ions 235 are manipulated by the beam-line components while the extracted ions 235 are directed toward the substrate 202. It is contemplated that the apparatus 200 may provide for improved mass selection to implant desired ions while reducing the probability of undesirable ions (impurities) being implanted in the substrate 202.

In some embodiments, the processing apparatus 200 can be controlled by a processor-based system controller such as controller 230. For example, the controller 230 may be configured to control beam-line components and processing parameters associated with beam-line ion implantation processes. The controller 230 may include a programmable central processing unit (CPU) 232 that is operable with a memory 234 and a mass storage device, an input control unit, and a display unit (not shown), such as power supplies, clocks, cache, input/output (I/O) circuits, and the like, coupled to the various components of the processing apparatus 200 to facilitate control of the substrate processing. The controller 230 also includes hardware for monitoring substrate processing through sensors in the processing apparatus 200, including sensors monitoring the substrate position and sensors configured to receive feedback from and control a heating apparatus coupled to the processing apparatus 200. Other sensors that measure system parameters such as substrate temperature and the like, may also provide information to the controller 230.

To facilitate control of the processing apparatus 200 described above, the CPU 232 may be one of any form of general-purpose computer processor that can be used in an industrial setting, such as a programmable logic controller (PLC), for controlling various chambers and sub-processors. The memory 234 is coupled to the CPU 232 and the memory 234 is non-transitory and may be one or more of readily available memory such as random access memory (RAM), read only memory (ROM), floppy disk drive, hard disk, or any other form of digital storage, local or remote. Support circuits 236 may be coupled to the CPU 232 for supporting the processor in a conventional manner. Implantation and other processes are generally stored in the memory 234, typically as a software routine. The software routine may also be stored and/or executed by a second CPU (not shown) that is remotely located from the hardware being controlled by the CPU 232.

The memory 234 is in the form of computer-readable storage media that contains instructions, that when executed by the CPU 232, facilitates the operation of the apparatus 200. The instructions in the memory 234 are in the form of a program product such as a program that implements the method of the present disclosure. The program code may conform to any one of a number of different programming languages. In one example, the disclosure may be implemented as a program product stored on computer-readable storage media for use with a computer system. The program(s) of the program product define functions of the embodiments (including the methods described herein). Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure.

It is to be understood that the various layers, structures, and regions shown in the accompanying drawings are schematic illustrations. For ease of explanation, one or more layers, structures, and regions of a type commonly used to form semiconductor devices or structures may not be explicitly shown in a given drawing. This does not imply that any layers, structures, and/or regions not explicitly shown are omitted from the actual semiconductor structures.

In various embodiments, design tools can be provided and configured to create the datasets used to pattern the semiconductor layers of the device 100, e.g., as described herein. For example, data sets can be created to generate photomasks used during lithography operations to pattern the layers for structures as described herein. Such design tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance running software, or implemented in hardware.

As used herein, a module might be implemented utilizing any form of hardware, software, or a combination thereof. For example, one or more processors, controllers, ASICs, PLAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading the Detailed Description, the various features and functionality described herein may be implemented in any given application and can be implemented in one or more separate or shared modules in various combinations and permutations. Although various features or elements of functionality may be individually described or claimed as separate modules, one of ordinary skill in the art will understand these features and functionality can be shared among one or more common software and hardware elements.

For the sake of convenience and clarity, terms such as "top," "bottom," "upper," "lower," "vertical," "horizontal," "lateral," and "longitudinal" will be understood as describing the relative placement and orientation of components and their constituent parts as appearing in the figures. The terminology will include the words specifically mentioned, derivatives thereof, and words of similar import.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporating the recited features.

Furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

Still furthermore, one of ordinary skill will understand when an element such as a layer, region, or substrate is referred to as being formed on, deposited on, or disposed "on," "over" or "atop" another element, the element can be directly on the other element or intervening elements may also be present. In contrast, when an element is referred to as being "directly on," "directly over" or "directly atop" another element, no intervening elements are present.

While certain embodiments of the disclosure have been described herein, the disclosure is not limited thereto, as the disclosure is as broad in scope as the art will allow and the specification may be read likewise. Therefore, the above description is not to be construed as limiting. Instead, the above description is merely as exemplifications of particular embodiments. Those skilled in the art will envision other modifications within the scope and spirit of the claims appended hereto.

What is claimed is:

1. A method for backside contact formation, comprising:
- providing a stack of layers defining a front side and a backside, wherein the front side comprises one or more devices;
- forming a plurality of vias in the backside, wherein each via of the plurality of vias extends to a source/drain;
- performing a dopant implant to the backside including into the plurality of vias, wherein the dopant implant is performed at a temperature greater than 300° C.;
- forming a silicide region within each of the source/drains; and
- forming a backside contact within each of the plurality of vias, wherein the backside contact is formed over the silicide region.

2. The method of claim 1, further comprising performing a pre-amorphization implant prior to performing the dopant implant.

3. The method of claim 2, wherein the pre-amorphization implant comprises germanium delivered at an energy between 1 keV and 4 keV.

4. The method of claim 1, further comprising performing a laser anneal after performing the dopant implant, wherein the laser anneal is performed at a temperature less than 650° C.

5. The method of claim 1, wherein the dopant implant is performed at a temperature less than 400° C., and wherein the dopant comprises at least one of the following: boron, gallium, phosphorus, arsenic, and antimony.

6. The method of claim 1, wherein forming the silicide region comprises forming a titanium silicide using a plasma-enhanced chemical vapor deposition (PECVD) titanium process.

7. The method of claim 1, further comprising forming a plurality of front side contacts in the stack of layers, wherein the plurality of front side contacts extends to the source/drains.

8. The method of claim 1, wherein forming the plurality of vias comprises performing a reactive ion etch into a substrate.

9. A method of dopant activation for backside contacts, comprising:
- providing a stack of layers comprising a source/drain, wherein the stack of layers defines a front side and a backside, and wherein a plurality of front side contacts are formed in the front side;
- forming a via in the backside, wherein the via extends to the source/drain;
- delivering a dopant into the via, wherein the dopant impacts an exposed surface of the source/drain, and wherein the dopant is delivered at a temperature greater than 300° C.;
- forming a silicide region along the exposed surface of the source/drain; and
- forming a backside contact within the via, wherein the backside contact is formed over the silicide region.

10. The method of claim 9, further comprising performing a pre-amorphization implant prior to delivering the dopant.

11. The method of claim 10, wherein the pre-amorphization implant comprises germanium delivered at an energy between 1 keV and 4 keV.

12. The method of claim 9, further comprising performing a laser anneal after delivering the dopant into the via, wherein the laser anneal is performed at a temperature less than 650° C.

13. The method of claim 9, wherein the dopant is delivered at a temperature less than 400° C., and wherein the dopant comprises at least one of the following: boron, gallium, phosphorus, arsenic, and antimony.

14. The method of claim 9, wherein forming the silicide region comprises forming a titanium silicide using a plasma-enhanced chemical vapor deposition (PECVD) titanium process.

15. The method of claim 9, wherein the plurality of front side contacts extend to the source/drains.

16. A method of forming backside via landings on a source/drain, comprising:
- providing a stack of layers comprising the source/drain, wherein the stack of layers defines a front side and a backside, and wherein a plurality of front side contacts are formed in the front side;
- forming a via in the backside, wherein the via extends to the source/drain;
- delivering a dopant into the via, wherein the dopant impacts an exposed surface of the source/drain, and wherein the dopant is delivered at a temperature between 300° C.-400° C.;
- forming a silicide region along the exposed surface of the source/drain; and
- forming a backside contact within the via, wherein the backside contact is formed over the silicide region.

17. The method of claim 16, further comprising performing a pre-amorphization implant prior to delivering the dopant, wherein the pre-amorphization implant comprises germanium delivered at an energy between 1 keV and 4 keV.

18. The method of claim 16, further comprising performing a laser anneal after delivering the dopant into the via, wherein the laser anneal is performed at a temperature less than 650° C.

19. The method of claim 16, wherein the dopant comprises at least one of the following: boron, gallium, phosphorus, arsenic, and antimony.

20. The method of claim 16, wherein forming the silicide region comprises forming a titanium silicide using a plasma-enhanced chemical vapor deposition (PECVD) titanium process.

* * * * *